United States Patent [19]

Crosby

[11] E Re. 31,606

[45] Reissued Jun. 19, 1984

[54] DIGITAL OHMMETER WITH ELECTRICAL CONTINUITY TESTER

[75] Inventor: John B. Crosby, Yorba Linda, Calif.

[73] Assignee: Beckman Instruments, Inc., Fullerton, Calif.

[21] Appl. No.: 280,430

[22] Filed: Jul. 6, 1981

Related U.S. Patent Documents

Reissue of:

[64] Patent No.: 4,228,394
Issued: Oct. 14, 1980
Appl. No.: 961,154
Filed: Nov. 16, 1978

[51] Int. Cl.[3] ..... G01R 27/02

[52] U.S. Cl. ..... 324/62; 324/51; 324/99 D

[58] Field of Search ..... 324/62, 51, 99 D; 340/347 AD

[56] References Cited

U.S. PATENT DOCUMENTS

| | | | |
|---|---|---|---|
| 3,536,997 | 10/1970 | Holt | 324/62 |
| 3,559,059 | 1/1971 | Martine et al. | 324/99 D |
| 3,588,690 | 6/1971 | Griffin | 324/62 X |
| 3,596,269 | 7/1971 | Laska | 324/51 X |
| 3,619,574 | 11/1971 | Mindheim | 324/99 D |
| 3,636,448 | 1/1972 | Nihashi et al. | 324/51 X |
| 3,714,569 | 1/1973 | Bruning, Jr. et al. | 324/99 D X |
| 3,831,089 | 8/1974 | Pearce | 324/51 X |
| 3,978,472 | 8/1976 | Jones | 324/62 X |
| 4,008,468 | 2/1977 | Imhoff et al. | 340/347 AD |
| 4,019,136 | 4/1977 | Wenz | 324/99 D X |
| 4,088,947 | 5/1978 | Farmer, Jr. | 324/51 |

OTHER PUBLICATIONS

Khan, Analog Linear-Scale Ohmmeter, IEEE Transactions on Instrumentation & Measurement, pp. 150–155, Jun. 1975.

*Primary Examiner*—Stanley T. Krawczewicz
*Attorney, Agent, or Firm*—R. J. Steinmeyer; F. L. Mehlhoff; Al A. Canzoneri

[57] ABSTRACT

In a digital test instrument such as a digital ohmmeter for measuring and digitally displaying the resistance of an unknown circuit element, there is included an electrical continuity tester coupled to the input of the digital ohmmeter for instantaneously and digitally indicating electrical continuity. Connection of the electrical continuity tester to the input of the digital ohmmeter is achieved in a manner such as to not overload or otherwise affect the accuracy of the resistance measurement.

17 Claims, 4 Drawing Figures

DIGITAL OHMMETER WITH ELECTRICAL CONTINUITY TESTER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to electrical test equipment and, more particularly, to a digital ohmmeter including apparatus for independently and digitally indicating electrical continuity.

2. Description of the Prior Art

Recent years have evidenced a rapid transformation of test instruments from ones having analog displays to ones having digital displays. Such instruments include voltmeters, ammeters, ohmmeters, and multimeters including all of the above functions. Test instruments having analog displays utilize meters, commonly a D'Arsonval movement, for providing a quantitative indication of the value of the unknown input. Digital instruments perform the same function, but display the output in digital form, commonly using a liquid crystal display.

A conventional digital test instrument such as an ohmmeter includes a pair of input terminals adapted to be connected across a circuit element of unknown resistance, a reference current of voltage source operatively coupled to the input terminals so that an analog voltage appears across the input terminals which is proportional to the resistance of the circuit element, a filter connected to one of the input terminals for filtering noise in the analog voltage, an analog-to-digital converter having an input connected to the filter and an output, a digital display, and driver circuit means connected between the output of the analog-to-digital converter and the input of the digital display.

While digital test instruments of the type previously described are generally regarded as being quantitatively precise and have, therefore, acquired a significant share of the electrical test equipment market, their analog counterparts show significant advantage in applications where trend, rather than absolute, information is desired. An example of this advantage is in continuity measurement. In such circumstances, an analog ohmmeter can be used to quickly determine if electrical continuity exists in a circuit. Often, the user is less interested in the absolute value of conduction than he is in measurement speed.

For instance, a telephone service technician might utilize an analog ohmmeter to quickly check for a shorted wire within a cable by simply brushing the meter probe along the cable's connection points. If a short were present, it would be indicated by a momentary deflection of the meter. If the test points are closely spaced, the practiced user could check a multiple conductor cable in less than a second.

Digital ohmmeters, on the other hand, are poorly suited to perform such tests. They exhibit an inherent delay of from 0.5 to 1.5 seconds, resulting from the precise analog-to-digital conversion process, which makes rapid continuity indication all but impossible. Some digital instrument manufacturers, realizing this difficulty, have incorporated an ancillary electromechanical meter in their product to achieve the capability for a rapid continuity indication. Unfortunately, such an addition exacts a high cost for the indicator and its attendant drive circuitry, as well as requiring additional panel space for the meter. Also, since an electromechanical meter is often the only delicate component incorporated in the instrument, its inclusion tends to compromise instrument ruggedness and reliability.

Other instrument manufacturers have provided a separate electrical continuity tester capable of producing a digital output. Unfortunately, the user now must purchase and use two separate instruments and this is not only inconvenient but costly.

OBJECTS, FEATURES, AND ADVANTAGES OF THE INVENTION

It is therefore an object of the present invention to solve the problem of providing a rapid continuity indication in a digital ohmmeter. It is a feature of the present invention to solve this problem by incorporating separate continuity test circuitry in a digital ohmmeter. It is a further feature of the present invention to provide such circuitry with a digital output. The advantages are that such additions can be done at an extremely nominal cost without requiring additional panel space for an extra meter. Another advantage is that the instrument maintains its ruggedness and reliability.

It is another object of the present invention to solve the problems associated with providing separate digital instruments for measuring resistance and continuity. It is a feature of the present invention to solve this problem by connecting to the input of a digital ohmmeter a digital continuity tester having a sufficiently high input impedance that it does not load or otherwise affect the accuracy of the readout of the digital ohmmeter. The advantage associated with this feature is that a single digital test instrument can be used to measure both electrical resistance and electrical continuity.

SUMMARY OF THE INVENTION

According to the present invention, there is provided an improved digital test instrument. More particularly, the present invention includes a digital ohmmeter in which the resistance measuring function is augmented by means for sensing and immediately indicating the presence of a continuous circuit at the input terminals thereof. This feature is useful when it is desired to rapidly check a number of circuits for continuity without regard to the actual value of resistance.

The digital ohmmeter portion of the present invention is of generally conventional structure and includes a pair of input terminals adapted to be connected across a circuit element of unknown resistance, a reference current or voltage source operatively coupled to the input terminals so that an analog voltage appears across the input terminals which is proportional to the resistance of the circuit element, a filter connected to one of the input terminals for filtering noise in the analog voltage, an analog-to-digital converter having an input connected to the filter and an output, a digital display, and driver circuit means connected between the output of the analog-to-digital converter and the input of the digital display.

The electrical continuity tester portion of the present invention includes a high input impedance, single bit, analog-to-digital converter connected to the one of the input terminals and a reference voltage source for providing a logical true or false signal depending upon whether the analog voltage is higher or lower than the reference voltage. The output of the converter is coupled to the driver circuit means and the digital display is provided with a unique symbol, preferably a Greek omega symbol, incorporated as part of the liquid crystal digital display for indicating continuity. In use as a continuity tester, the omega symbol will be energized within the response time of the analog-to-digital converter and the display, normally less than 100 ms.

Other objects, features, and attendant advantages of the present invention will become apparent to those skilled in the art from a reading of the following detailed description of the preferred embodiment constructed in accordance therewith, taken in conjunction with the accompanying drawings wherein like numerals designate like parts in several figures and wherein:

DESCRIPTION OF THE PREFERRED EMBODIMENT

Figure 1:
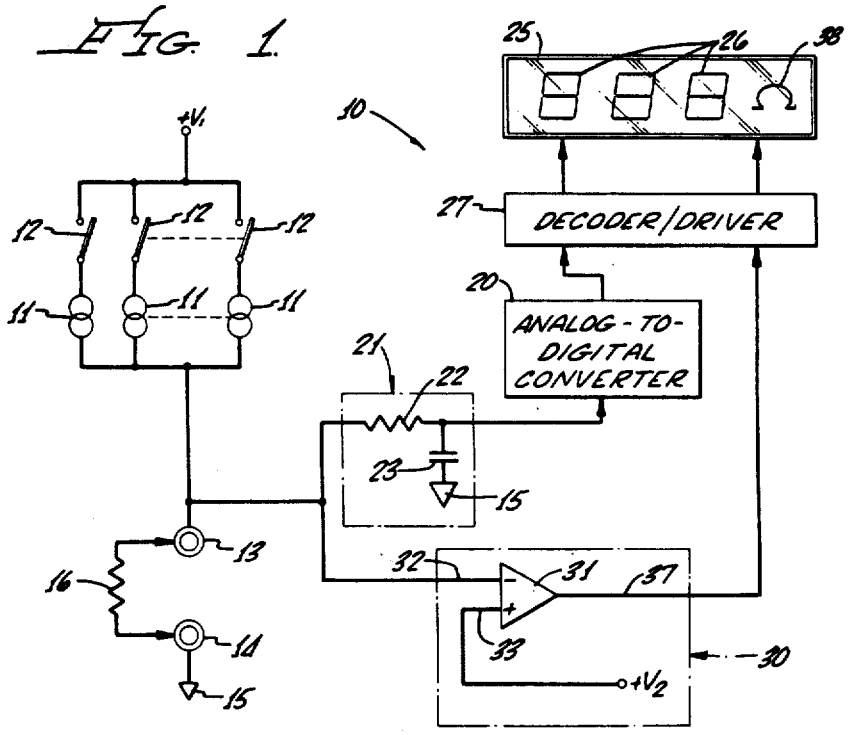
FIG. 1 is a schematic circuit diagram of a digital test instrument constructed in accordance with the teachings of the present invention.

Referring now to the drawings and, more particularly, to FIG. 1 thereof, there is shown a simplified block diagram of a digital test instrument, generally designated 10, constructed in accordance with the teachings of the present invention. Specifically, instrument 10 includes a digital ohmmeter and a digital electrical continuity tester. The ohmmeter portion of instrument 10 includes a plurality of weighted current sources 11, three being shown by way of example, each connected in series with a switch 12, three switches being shown. The multiple current sources 11 and the multiple switches 12 comprise the range selection circuitry of a multi-range ohmmeter. Thus, all of sources 11 and switches 12 are connected in parallel between a voltage source $+V_1$ and a first input terminal 13 of instrument 10. Instrument 10 includes a second input terminal 14 which may be connected to ground 15.

Depending upon which of switches 12 is closed, a selected current flows through an unknown resistor 16 when the opposite ends thereof are connected to input terminals 13 and 14. This produces a positive voltage at terminal 13 which is in direct proportion to the absolute value of unknown resistance 16. Other methods for obtaining a voltage proportional to an unknown resistance are, of course, possible and are well known to those skilled in the art.

Instrument 10 includes a conventional analog-to-digital converter 20 for converting an analog voltage appearing at its input to a digital representation thereof at its output. The analog voltage at terminal 13 is connected to the input of analog-to-digital converter 20 via an input filter 21 which typically consists of a resistor 22 connected between input terminal 13 and the input of converter 20 and a capacitor 23 connected between the input of converter 20 and ground 15. Filter 21 is typical of the type of filters used in contemporary digital meters and is needed to assure the stability of the displayed reading. However, it is the same filter which contributes to the overall response delay of the digital ohmmeter portion of instrument 10, as will be explained more fully hereinafter.

Instrument 10 includes a digital readout 25 which is preferably a twisted nematic liquid crystal display of the type well known to those skilled in the art, including three multiple segment display elements 26, each display element 26 including seven bars capable of displaying the numbers 1 through 9. Readout 25 is driven by conventional decoder/driver circuitry 27 connected between the output of converter 20 and the input of readout 25. Decoder/driver 27 analyzes the output of converter 20 and converts it to a form suitable for driving the multiple segments of display elements 26. All of the above portions of digital test instrument 10 are known to those skilled in the art.

Instrument 10 further includes circuitry, generally designated 30, to detect and immediately signal electrical continuity across terminals 13 and 14. Specifically, circuitry 30 includes a single bit analog-to-digital converter 31 which senses the voltage across unknown resistor 16 directly, without a filter or other delay producing means. Specifically, converter 31 is preferably a comparator having an extremely high input impedance stage, such as a MOSFET input stage, which typically has an input impedance in excess of $10^{12}$ ohms. Comparator 31 has an inverting input 32 which is connected directly to input terminal 13. A reference voltage $+V_2$ is applied to the non-inverting input 33 of comparator 31.

It will be seen that for all unknown voltages more positive than reference voltage $+V_2$, the output of comparator 31 on line 37 will be low, a logical "false". Also, for unknown voltages less than positive than reference voltage $+V_2$, the output of comparator 31 on line 37 will be high, a logical "true".

The output of comparator 31 on line 37 is connected to decoder/driver circuitry 27 which drives a special symbol 38 included in readout 25. According to the preferred embodiment of the present invention, symbol 38 comprises a Greek Ω symbol which is incorporated as part of the twisted nematic liquid crystal structure in display 25. Decoder/driver 27 utilizes the output of comparator 31 to energize or de-energize Ω symbol 38.

Figure 2:
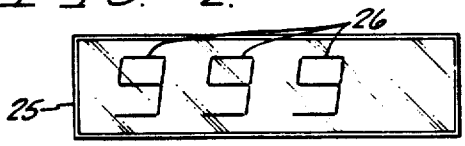
FIG. 2 shows the display output of the instrument of FIG. 1 during a steady state open circuit condition.

In operation, for an open circuit condition at input terminals 13 and 14 of instrument 10, the voltage appearing at input filter 21 and comparator 31 will be limited only by the compliance of the selected constant current generator and will, in any event, be greater than reference voltage $+V_2$, causing a logical false level to exist at output 37 of comparator 31. As a result, Ω symbol 38 is not enabled in display 25, the only reading displayed at this time being an over-range display supplied by converter 20. This is shown in FIG. 2 where an over-range signal is indicated by the maximum reading "999" on elements 26. This is further verified by the absence of continuity indicator symbol 38. An alternative to displaying the reading "999" would be to display the reading "OL" as a shorthand for over-load.

Figure 3:
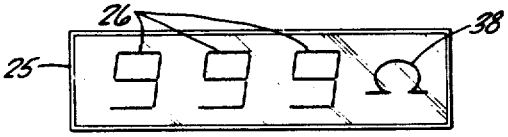
FIG. 3 shows the display output of the instrument of FIG. 1 during the initial period of a closed circuit condition.

With reference voltage $+V_2$ being set to some value related to that required for a full scale indication from the ohmmeter section of instrument 10, a rapidly falling unknown input drop, such as that resulting from input terminals 13 and 14 being shorted together during a measurement, will cause the output of comparator 31 to immediately switch to a logical true state when the unknown voltage instantaneously reaches the approximate comparison level at input 33. Within the response time of comparator 31 and display 25, normally less than 100 ms, and long before the output of converter 20 would respond to the unknown input drop, Ω symbol 38 will be energized in display 25, giving a rapid indication of the continuity condition. These circumstances are shown in FIG. 3. At this point in time, the measuring system of instrument 10 has not yet had sufficient time to measure and display a resistance change, but Ω symbol 38 is energized. Depending on the specific design of instrument 10, the behaviour of display elements 26 prior to reaching a steady reading may differ from what is shown in FIG. 3.

Figure 4:
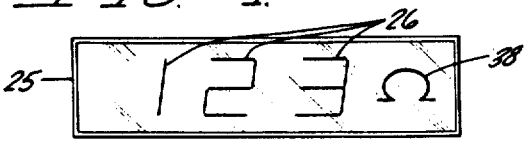
FIG. 4 shows the display output of the instrument of FIG. 1 during a steady state closed circuit condition.

Subsequently, as input filter 21 and analog-to-digital converter 20 settle, the numerical portion of display 25 would come out of overload and read out the quantitative value of unknown resistor 16. This condition is shown in FIG. 4 wherein sufficient time, approximately 0.5 to 1.5 seconds, has passed to permit a resistance measurement to be completed and its value displayed by display elements 26. Continuity indicator 38 continues to be illuminated as long as a closed circuit condition exists at input terminals 13 and 14.

It can therefore be seen that the present invention does indeed solve the problem of providing a rapid continuity indication in a digital ohmmeter. This problem is solved by incorporating separate continuity test circuitry 30 in digital ohmmeter 10. Continuity test circuitry 30 has a digital display 38 so that a separate digital display is not required therefor. Circuitry 30 is added to instrument 10 at an extremely nominal cost, without requiring additional panel space for an extra meter. Furthermore, instrument 10 maintains its ruggedness and reliability.

It is also seen that the present invention solves the problems associated with providing separate digital instruments for measuring resistance and continuity. Digital continuity test circuitry 30 has a sufficiently high input impedance that it does not load or otherwise affect the accuracy of the readout of the digital measurement portion of instrument 10. As a result, instrument 10 can be used to measure both electrical resistance and electrical continuity.

While the invention has been described with respect to the preferred physical embodiment constructed in accordance therewith, it will be apparent to those skilled in the art that various modifications and improvements may be made without departing from the scope and spirit of the invention. Accordingly, it is to be understood that the invention is not to be limited by the specific illustrative embodiment, but only by the scope of the appended claims.

I claim:

1. In a digital test instrument for measuring resistance including a pair of input terminals adapted to be connected across a circuit element of unknown resistance, a first reference current or voltage source operatively couple to said input terminals so that an analog voltage appears across said input terminals which is proportional to the resistance of said circuit element, a filter connected to one of said input terminals for filtering noise in said analog voltage, an analog-to-digital converter having an input connected to said filter and an output, a digital display, and driver circuit means connected between said output of said analog-to-digital converter and said digital display, the improvement comprising means for detecting and immediately signalling electrical continuity across said input terminals comprising:

a single bit analog-to-digital converter having first and second input terminals, said first input terminal being connected directly to said one of said input terminals, said converter having a sufficiently high input impedance not to affect the operation of said resistance measuring circuitry of said digital test instrument;

a second source of reference voltage operatively connected to said second input terminal of said single bit analog-to-digital converter, said single bit analog-to-digital converter generating a logical true or logical false signal depending upon whether said analog voltage is higher or lower than said second reference voltage;

a digital continuity display; and driver circuit means connected between said single bit analog-to-digital converter and said digital continuity display for instantaneously indicating continuity.

2. In a digital test instrument according to claim 1, the improvement wherein said single bit analog-to-digital converter comprises:

a comparator.

3. In a digital test instrument according to claim 2, the improvement wherein said comparator has an inverting input connected directly to said one of said input terminals and a noninverting input connected to said second source of reference voltage, said comparator generating a logical false signal when said analog voltage is greater than said second reference voltage.

4. In a digital test instrument according to claim 3, the improvement wherein said comparator generates a logical true signal when said analog voltage is less than said second reference voltage.

5. In a digital test instrument according to claim 2, 3, or 4, the improvement wherein said comparator has a MOSFET input stage having an input impedance in excess of approximately $10^{12}$ ohms.

6. In a digital test instrument according to claim 1, 2, 3, or 4, the improvement wherein said digital continuity display is part of said digital display.

7. In a digital test instrument according to claim 1, 2, 3, or 4, the improvement wherein said driver circuit means connected between said single bit analog-to-digital converter and said digital continuity display is the same as said driver circuit means connected between said analog-to-digital converter and said digital display.

*8. A digital test instrument for measuring resistance comprising:*

*a pair of input terminals adapted for connection across a circuit element of unknown resistance;*

*means for producing a voltage across the input terminals the value of which indicates the value of the unknown resistance;*

*a digital display and means for operating the display to indicate the value of the unknown resistance, the digital test instrument exhibiting a measuring time delay before the display indicates the value of the unknown resistance; and*

*means for substantially instantaneously detecting and signaling the presence of electrical continuity across the input terminals including:*

*a continuity indicator;*

*means for energizing the continuity indicator; and*

*means for selecting whether the continuity indicator is energized according to whether the voltage across the input terminals is greater or less than a reference voltage.*

*9. The digital test instrument according to claim 8, wherein said continuity indicator comprises means for displaying a continuity symbol.*

*10. The digital test instrument according to claim 9, wherein said means for displaying a continuity symbol is part of said digital display.*

*11. The digital test instrument according to claim 9, wherein the means for selecting whether the continuity indicator is energized comprises a one-bit analog-to-digital converter.*

*12. The digital test instrument according to claim 11, wherein the one-bit converter has a first input connected directly to one of the input terminals of the instrument and a second input connected to a source of the reference voltage, the one-bit converter generating a logical signal of a first logic state when the voltage across the input terminals is greater than the reference voltage and of a second logic state when the voltage across the input terminals is less than the reference voltage, the logical signal being supplied to the continuity indicator energizing means.*

*13. A digital test instrument according to claim 12, wherein said first input is an inverting input and said second signal is a non-inverting input and wherein the one-bit converter generates a logical false signal when the voltage across the input terminals is greater than the reference voltage and a logical true signal when the voltage across the input terminals is less than the reference voltage.*

*14. The digital test instrument according to any of claims 11, 12 or 13, wherein the one-bit converter has an input impedance in excess of approximately* $10^{12}$ *ohms.*

*15. A digital test instrument for measuring resistance including:*

*a pair of instrument input terminals adapted to be connected across a circuit element of unknown resistance;*

*means for producing a voltage across said instrument input terminals the value of which indicates the value of the unknown resistance;*

*an analog-to-digital converter having an input connected to one of the instrument input terminals and having an output;*

*a digital display;*

*driver circuit means connected between the output of the analog-to-digital converter and the digital display for operating the display to indicate the value of the unknown resistance; and*

*means for detecting and immediately signaling electrical continuity across the instrument input terminals comprising:*

*a reference voltage source;*

*a one-bit analog-to-digital converter having first and second inputs and an output, the first input of the one-bit converter being connected to one of the instrument input terminals and the second input of the one-bit converter being connected to the reference voltage source, the one-bit analog-to-digital converter generating at its output a logical signal having either a logical true or a logical false value depending upon whether said analog voltage appearing across the instrument input terminals is higher or lower than the reference voltage;*

*continuity symbol display means for receiving an energizing signal and for displaying a continuity symbol in response thereto; and*

*driver circuit means connected between the output of the one-bit analog-to-digital converter and the continuity symbol display means for instantaneously indicating continuity by selectively supplying the energizing signal to the continuity symbol display depending on whether the logical value of the logical signal generated by the one-bit analog-to-digital converter is true or false.*

*16. The digital test instrument according to claim 15, wherein the continuity symbol display means is part of said digital display.*

*17. The digital test instrument of claim 15, wherein the one-bit converter has an input impedance in excess of approximately* $10^{12}$ *ohms.*

* * * * *